(12) United States Patent
Cook et al.

(10) Patent No.: US 11,530,917 B2
(45) Date of Patent: Dec. 20, 2022

(54) METHODS FOR FABRICATING SILICON MEMS GYROSCOPES WITH UPPER AND LOWER SENSE PLATES

(71) Applicant: The Charles Stark Draper Laboratory, Inc., Cambridge, MA (US)

(72) Inventors: Eugene H. Cook, Acton, MA (US); Jonathan J. Bernstein, Medfield, MA (US); Mirela G. Bancu, Melrose, MA (US); Marc Steven Weinberg, Dedham, MA (US); William Sawyer, Littleton, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 0 days.

(21) Appl. No.: 16/580,618

(22) Filed: Sep. 24, 2019

(65) Prior Publication Data

US 2020/0096336 A1 Mar. 26, 2020

Related U.S. Application Data

(60) Provisional application No. 62/735,512, filed on Sep. 24, 2018.

(51) Int. Cl.
| | |
|---|---|
| *G01C 19/5621* | (2012.01) |
| *B81C 1/00* | (2006.01) |
| *B81B 3/00* | (2006.01) |
| *G01C 19/5628* | (2012.01) |

(52) U.S. Cl.
CPC ........ *G01C 19/5621* (2013.01); *B81B 3/0097* (2013.01); *B81C 1/00166* (2013.01); *G01C 19/5628* (2013.01); *B81B 2201/0242* (2013.01); *B81B 2203/04* (2013.01); *B81B 2207/096* (2013.01); *B81C 2201/0132* (2013.01); *B81C 2201/0133* (2013.01); *B81C 2203/035* (2013.01); *B81C 2203/036* (2013.01)

(58) Field of Classification Search
CPC ............ G01C 19/5621; G01C 19/5628; B81C 1/00166; B81C 2203/036; B81C 2203/035; B81C 2201/0132; B81C 2201/0133; B81C 2203/0118; B81B 3/0097; B81B 2203/04; B81B 2201/0242; B81B 2207/096; B81B 7/0038; H01L 41/22; H01L 41/29; H01L 41/27; Y10T 29/42
USPC ..................... 29/25.35, 592.1, 829
See application file for complete search history.

(56) References Cited

U.S. PATENT DOCUMENTS

| | | |
|---|---|---|
| 5,481,914 A | 1/1996 | Ward |
| 5,747,961 A | 5/1998 | Ward et al. |
| 5,911,156 A | 6/1999 | Ward et al. |
| 6,122,961 A | 9/2000 | Geen et al. |
| 6,189,381 B1 * | 2/2001 | Huang ............... G01C 19/5656 73/504.12 |

(Continued)

OTHER PUBLICATIONS

Trusov, A.A., et al., "Ultra-High Q Silicon Gyroscopes with Interchangeable Rate and Whole Angle Modes of Operation," IEEE Sensors, 864-867 (2010).

*Primary Examiner* — Minh N Trinh
(74) *Attorney, Agent, or Firm* — HoustonHogle LLP

(57) ABSTRACT

Methods for fabricating MEMS tuning fork gyroscope sensor system using silicon wafers. This provides the possibly to avoid glass. The sense plates can be formed in a device layer of a silicon on insulator (SOI) wafer or in a deposited polysilicon layer in a few examples.

8 Claims, 13 Drawing Sheets

(56) References Cited

U.S. PATENT DOCUMENTS

| | | | |
|---|---|---|---|
| 6,505,511 B1 | 1/2003 | Geen et al. | |
| 6,548,321 B1* | 4/2003 | Sawyer | B81C 1/0092 |
| | | | 438/50 |
| 6,673,694 B2 | 1/2004 | Borenstein | |
| 6,689,211 B1 | 2/2004 | Wu et al. | |
| 6,862,934 B2 | 3/2005 | Weinberg et al. | |
| 6,946,314 B2 | 9/2005 | Sawyer et al. | |
| 7,036,373 B2 | 5/2006 | Johnson et al. | |
| 7,172,919 B2* | 2/2007 | Weinberg | G01C 19/5719 |
| | | | 438/50 |
| 7,227,176 B2 | 6/2007 | Wu et al. | |
| 7,300,814 B2 | 11/2007 | Cunningham et al. | |
| 7,426,861 B2 | 9/2008 | Weinberg et al. | |
| 2003/0066351 A1 | 4/2003 | Weinberg et al. | |
| 2005/0084998 A1* | 4/2005 | Horning | B81B 7/007 |
| | | | 438/48 |
| 2005/0274182 A1 | 12/2005 | Geen et al. | |
| 2006/0283246 A1 | 12/2006 | Weinberg et al. | |
| 2011/0126632 A1* | 6/2011 | McNeil | G01L 19/0092 |
| | | | 73/718 |
| 2012/0248615 A1* | 10/2012 | Chien | B81C 1/00238 |
| | | | 257/770 |
| 2013/0334620 A1* | 12/2013 | Chu | B81C 1/00238 |
| | | | 257/415 |
| 2015/0166330 A1* | 6/2015 | Lee | B81C 1/00301 |
| | | | 257/418 |
| 2015/0375995 A1* | 12/2015 | Steimle | B81C 1/00246 |
| | | | 257/418 |
| 2016/0318757 A1* | 11/2016 | Chou | B81C 1/00357 |
| 2017/0210612 A1* | 7/2017 | Chen | B81B 3/001 |

* cited by examiner

METHODS FOR FABRICATING SILICON MEMS GYROSCOPES WITH UPPER AND LOWER SENSE PLATES

RELATED APPLICATIONS

This application claims the benefit under 35 USC 119(e) of U.S. Provisional Application No. 62/735,512, filed on Sep. 24, 2018, which is incorporated herein by reference in its entirety.

BACKGROUND OF THE INVENTION

Currently vehicle localization is performed by fusing data from a combination of sensors that may include inertial measurement units (IMUs), wheel speed sensors, global positioning system (GPS) chipsets, and perception sensors that observe the environment external to the vehicle, including RADAR systems, cameras, and LIDAR systems. Of these sensors, the IMU, is the least susceptible to the external environment, making it a more reliable source of localization information.

Further, analysis has shown that the most critical component for localization accuracy within an IMU is the gyroscope. A good candidate for the IMU gyroscope is type of gyroscope called a tuning fork gyroscope. These devices can be fabricated using MicroElectroMechanical Systems (MEMS) fabrication processes which enable low cost and high precision devices.

Previously, many MEMS tuning fork gyroscopes have been constructed using a silicon-on-glass fabrication process. Briefly, that process involves constructing upper and lower sense plates (USP and LSP), which consist of etched glass wafers with mesas etched in them and metal traces and electrodes attached to them. The lower wafer, containing the LSP, is anodically bonded to a Silicon-on-Insulator wafer (SOI) which contains two layers; the thicker handle layer is removed, leaving the thinner device layer attached to the lower sense plate by the etched anchors thereon. The flexures and electrodes are etched into the device layer, and then the upper wafer is anodically bonded on.

The glass-based fabrication process has the advantage of being forgiving with regards to material defects and surface polish during the bond. This is because the large electrostatic attraction forces during bonding can overcome particles or scratches interfering with the bond.

SUMMARY OF THE INVENTION

Silicon-to-silicon wafer-bonded MEMS devices tend to be more robust than devices including glass, but wafer to wafer bonding can be temperamental. However, this issue can be overcome in a sufficiently clean and well-maintained facility.

Another issue concerns parasitic capacitance. As a general rule, glass provides lower parasitic capacitances than silicon wafer material. When made from glass, the lower and upper wafers do not include conductors other than the electrodes. However, by increasing the thickness of buried oxide layer in a silicon on insulator (SOI) process, the parasitic capacitances of a wafer bonded device can be decreased.

One of the main drawbacks of the glass process is that it includes several different materials, and, in particular, relatively large pieces of glass. Differential thermal expansion of the glass and silicon is a leading cause of errors in the fabricated gyroscopes, as drive and sense frequencies shift relative to each other with the changing stresses. Additionally, the anodic bond cannot form a vacuum tight seal without shorting the signal traces together, so the device must be packaged into a vacuum-sealed package. This packaging effort is a major cost driver, and can be eliminated by sealing the devices directly on the wafer using an all-silicon i.e., no-glass, process.

In general, according to one aspect, the invention features a method for fabricating tuning for gyroscope sensors. It comprises fabricating at least one sense plate in a silicon wafer and bonding the sense plate to a device wafer in which a proof mass has been formed.

In embodiments, the method further comprises fabricating an upper sense plate in a first silicon wafer and a lower sense plate in a second silicon wafer; and bonding the first wafer and the second wafer to either side of the device wafer.

In some embodiments, through silicon vias are formed through a handle layer of the silicon wafer and wire bonding is performed into the vias to establish electrical connections for the sensors. In other cases, the vias are filled with conducting polysilicon or other conductive material to provide electrical connections for the sensors.

Preferably, the step of bonding the sense plate to the device wafer is performed in a vacuum in order to yield a vacuum sealed sensor. In this way, a volumetric region in a sealing ring and around the proof mass is evacuated.

Different bonding strategies can be used including direct bonding the silicon wafer to the device wafer and/or metal bonding the silicon wafer to the device wafer.

In general, according to one aspect, the invention features a tuning fork gyroscope sensor, comprising a silicon sense plate, possibly separated from a silicon handle layer by a silicon oxide layer, for example, and a silicon wafer proof mass bonded to the sense plate.

The above and other features of the invention including various novel details of construction and combinations of parts, and other advantages, will now be more particularly described with reference to the accompanying drawings and pointed out in any claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

The invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

As used herein, the term "and/or" includes any and all combinations of one or more of the associated listed items. Further, the singular forms and the articles "a", "an" and "the" are intended to include the plural forms as well, unless expressly stated otherwise. It will be further understood that the terms: includes, comprises, including and/or comprising, when used in this specification, specify the presence of stated features, integers, steps, operations, elements, and/or components, but do not preclude the presence or addition of one or more other features, integers, steps, operations, elements, components, and/or groups thereof. Further, it will be understood that when an element, including component or subsystem, is referred to and/or shown as being connected or coupled to another element, it can be directly connected or coupled to the other element or intervening elements may be present.

It will be understood that although terms such as "first" and "second" are used herein to describe various elements, these elements should not be limited by these terms. These terms are only used to distinguish one element from another element. Thus, an element discussed below could be termed a second element, and similarly, a second element may be termed a first element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
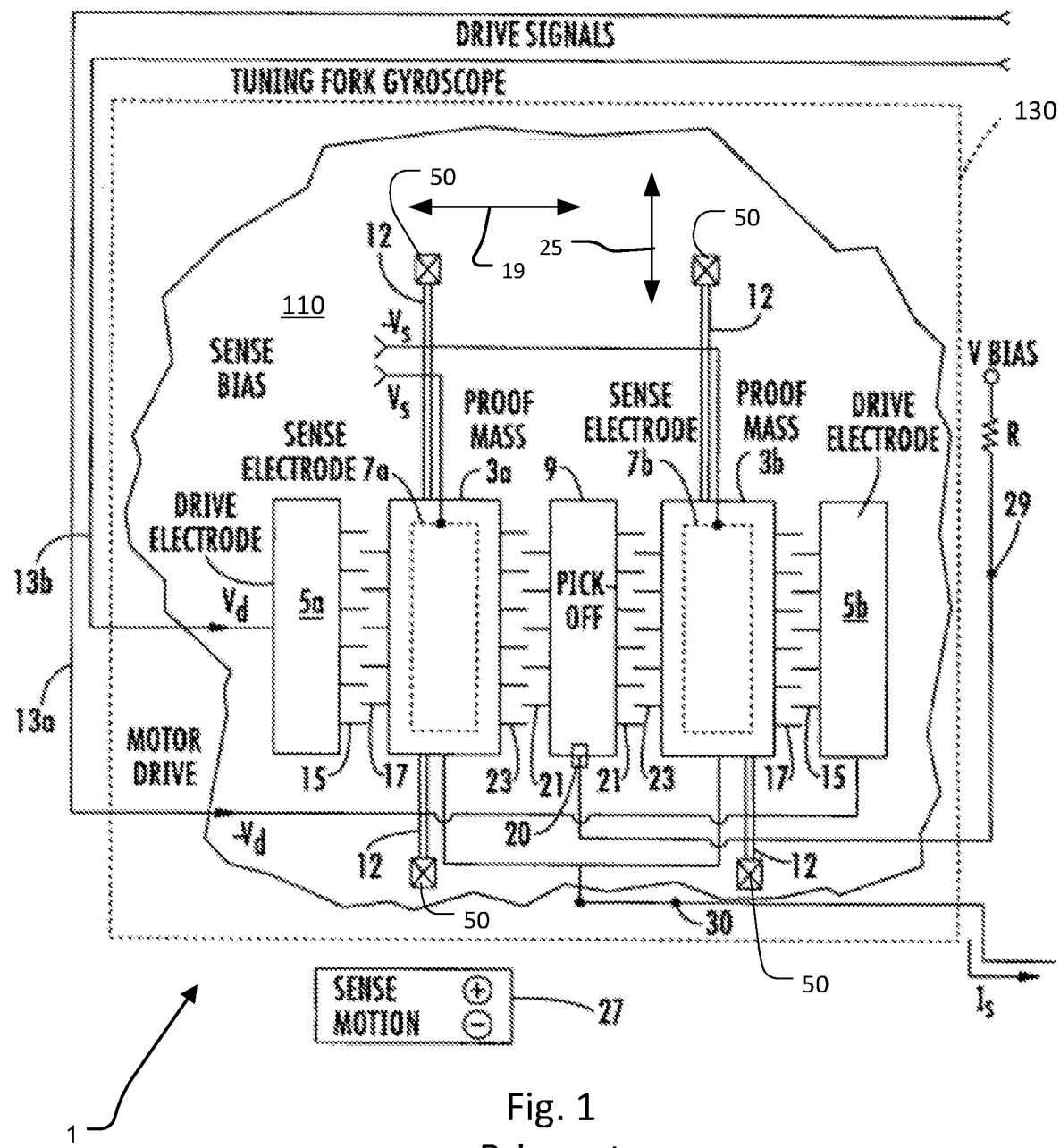
FIG. 1 is a schematic top view of a typical tuning fork gyroscope according to the prior art.

FIG. 1 is a schematic top view of a typical tuning fork gyroscope 1. It includes a pair of proof masses 3a and 3b suspended above a lower sense plate substrate (e.g., wafer) 110 by support flexure structure 12 connected to anchors 50. The gyroscope 1 also includes a pair of drive electrode structures 5a and 5b, and pick-off or in-plane sense electrode structure 9. Out-of-plane sense plate electrodes 7a and 7b are deposited on substrate 110 beneath proof masses 3a and 3b. A second set of out-of-plane sense plate electrodes 8a, 8b (not shown in this view) are deposited on an upper sense plate substrate 130 above proof masses 3a and 3b.

Drive signals 13a and 13b are provided to drive electrodes 5a and 5b, respectively, as shown. The drive electrodes 5a and 5b include comb-like geometry electrode fingers 15 extending and toward an adjacent one of proof masses 3a and 3b. Similarly, proof masses 3a and 3b have comb-like electrode fingers 17 extending toward the adjacent one of the fixed drive electrodes 5a and 5b and interleaved with the electrode fingers 15 of the corresponding drive electrode. Electrostatic coupling of the drive signals 13a and 13b to the corresponding proof masses 3a and 3b imparts vibration to the proof masses in the plane of the tuning fork gyroscope in the direction indicated by arrow 19.

A DC voltage VS (labeled "sense bias") is applied to the out-of-plane sense plate electrodes 7a, 7b, 8a, 8b for establishing a potential difference so that a change in the capacitance between electrodes 7a, 7b, 8a, 8b and the proof masses 3a and 3b results in a charge on the proof masses 3a and 3b. At resonance, the proof mass displacement lags drive force by 90 degrees.

In-plane sense or pick-off electrode structure 9 is disposed between proof masses 3a and 3b and also has comb-like electrode fingers 21 extending from the opposite sides toward the adjacent one of the proof masses. Each of the proof masses 3a and 3b has similar electrode fingers 23 extending toward electrode structure 9 and interleaved with the electrode fingers 21.

In response to an inertial input, and specifically to a rotational rate about an input axis 25, the proof masses 3a and 3b deflect out of the plane of vibration, i.e., about an axis 27 orthogonal to an input axis 25 (labeled "sense motion"). Such an out-of-plane deflection of proof masses 3a and 3b occurs at a frequency corresponding to the resonant frequency of the proof masses and with an amplitude corresponding to the input rotational rate. Thus, detection of the out-of-plane deflection of proof masses 3a and 3b provides a measure of the rotational rate. A bias signal Vbias is coupled to in-plane pick-off electrode structure 9 at 20 through resistor R to enable detection of charge variations caused by displacement of proof masses 3a and 3b in the plane of vibration. The resistor R with an impedance is connected between Vbias and the in-plane pick-off to permit the signal at the pick-off to reflect modulation effects from charge, capacitance, and voltage values. An output 29 (measured in Volts) from the in-plane pick-off is thus indicative of the in-plane deflection of the tuning fork gyroscope. Vbias is typically a DC signal. See U.S. Pat. Nos. 5,747,961 and 5,481,914 incorporated herein by this reference.

In operation, the drive electrodes oscillate the proof masses electrostatically in the plane of the device. Then, in response to an inertial input, the proof masses deflect out of the plane of vibration and this deflection is detected by the pick-off electrode. Typically, a DC bias voltage is applied to the sense plates 7a, 7b, 8a, 8b above and below the proof masses, and another DC bias voltage is applied to the pick-off electrode structures.

FIGS. 2A, 2B, 2C, 2D, 2E, 2F, 2G, and 2H show the successive steps of a first fabrication process for fabricating a MEMS tuning fork gyroscope sensor 1 based on SOI wafers.

In general, this process replaces the two glass wafers, which form the upper and lower sense plates, with silicon wafers serving the same function. The change is important to allow the device to be more easily fabricated in existing production fabrication facilities, which are not typically equipped to handle glass wafer processing. It further allows the device to be vacuum encapsulated at the wafer scale, which can reduce costs, as needed for different markets such as the automotive market. Finally, using a single material (silicon) instead of three (silicon, glass, and metal) over large areas relieves stresses that arise from coefficient of thermal expansion (CTE) mismatches, and the associated hysteretic and creep behaviors that cause long-term drifts in key performance parameters.

As shown in FIGS. 2A-2D, first the lower wafer is constructed.

Figure 2A:
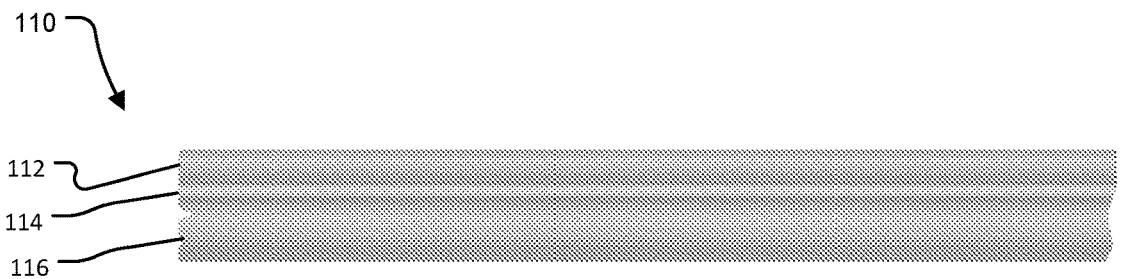
FIGS. 2A, 2B, 2C, 2D, 2E, 2F, 2G, and 2H are schematic partial side cross-section views taken in the region of one of the proof masses and other components, to show the successive steps of a first fabrication process for fabricating a MEMS tuning fork gyroscope sensor based on SOI wafers according to the invention.

FIG. 2A shows a first SOI lower sense plate (LSP) wafer 110 having a lower sense plate layer 112, a LSP handle layer 116, and an intervening silicon oxide layer 114.

Such SOI wafers are usually characterized by a first silicon wafer that has been bonded to a second wafer, with the intervening insulator. Such wafers can be fabricated by wafer bonding in which the insulator layer is formed by directly bonding an oxidized silicon handle wafer with a second wafer. The majority of the second wafer is polished away with its remnants forming a device layer. In an alternative SIMOX technique, an oxygen ion beam implantation process is followed by high temperature annealing to create buried oxide layer 114.

Figure 2B:
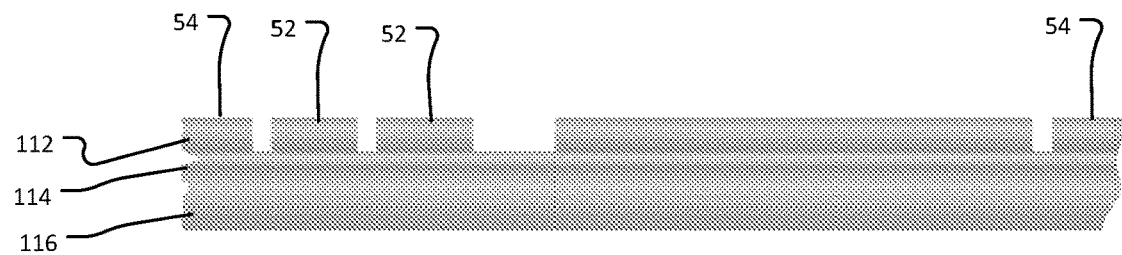
Figure 2C:
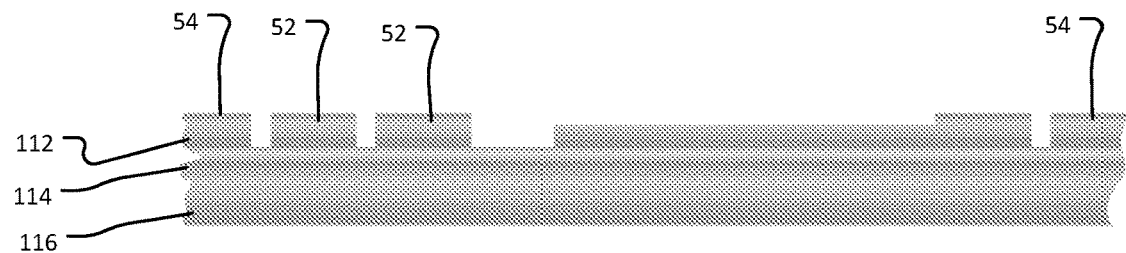

As shown in FIG. 2B, the lower sense plate layer 112 is patterned stopping on the oxide layer 114. Specifically, the lower sense plate 7, anchor mesas 52, and perimeter mesa 54 are etched into the lower sense plate layer 112 of the wafer 110. Two different etch depths may be necessary as shown in FIG. 2C, depending on the subsequently used bonding technology, so that a vertical sense-plate gap can be created between the lower sense plate 7 and the mesa 52.

In some bonding technologies, the bonding layer may provide this gap, rendering the 2nd etch unnecessary.

The LSP wafer 110 may also be created using polysilicon. In this case a plain wafer would be oxidized to provide the insulating oxide layer, and one or two doped polysilicon layers would be applied, by LPCVD or similar technique. One or two etch steps would be used to define the sense plate and anchor mesa features. Polysilicon has the advantage of being faster and cheaper, and can also have a well-defined thickness that will enable precise control of the sense-plate gap. However, polysilicon may include inherent stresses and stress-gradients that adversely affect the thermal and long-term stability of the device. Polysilicon may also have a rough surface that is unsuitable for wafer bonding. The later issue may be corrected by employing a Chemical Mechanical Polishing (CMP) step.

Figure 2D:
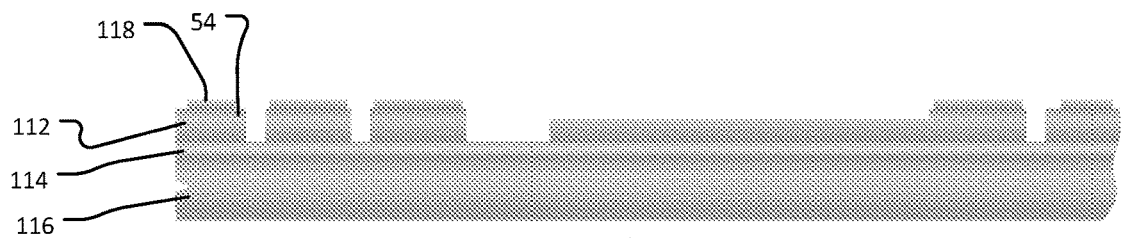

As shown in FIG. 2D, after the sense plate 7 and anchor mesas 52 are defined, the wafer bonding material layer 118 may be applied to the patterned lower sense plate layer 112, outside the regions of the lower sense plate and specifically on the to the anchor mesas 52 and the perimeter mesas 54.

A device layer 120 is then applied to the LSP wafer 110.

Several bonding techniques are possible. Direct bonding, also known as fusion bonding silicon-silicon bonding, or SDB (silicon direct bond), involves placing the two bare silicon parts (the surfaces of the anchor and perimeter mesas and the device wafer) in intimate contact. Van der Waals forces hold the surfaces together temporarily, and the bond can be converted to a strong covalent form by annealing at temperatures above 800 Celsius (C).

Direct bonding is extremely sensitive to surface smoothness and cleanliness, and is therefore challenging to achieve at low cost. It does however avoid issues related to creep and relaxation of softer materials like metals.

Eutectic or solder bonds rely on melting a metal that will form the bond material. Eutectics utilize a specific ratio of metal components that lower the melting point so that lower bonding temperatures (order 400 C) can be used. The metals can be applied by such techniques as sputtering or evaporation, with photolithographic definition via lift-off or etching. Commonly used eutectics include Al—Ge, Al—Si, Au—Si, and Au—Sn. Indium based solders and eutectics are also common. A metal seal can also be formed by reacting the metal with the silicon to form a silicide. Metals such as Pd, Pt, and Ni form silicides at temperatures around 400 C.

These silicide bonding techniques also require less metal thickness to work, which reduces errors arising from CTE mismatches. The silicide metals tend also to be less soft, and experience smaller plastic deformations and creep effects, improving long-term drift performance of the instrument After the device layer 120 is bonded to the LSP wafer 110, the device wafer is thinned to the desired final thickness. This is typically accomplished by using an SOI wafer for the device layer, which has a well-defined layer thickness in contact with the anchor mesas. The handle and the oxide of this SOI wafer are then polished away and the device layer of the SOI is further thinned to the desired thickness, if required.

Figure 2E:
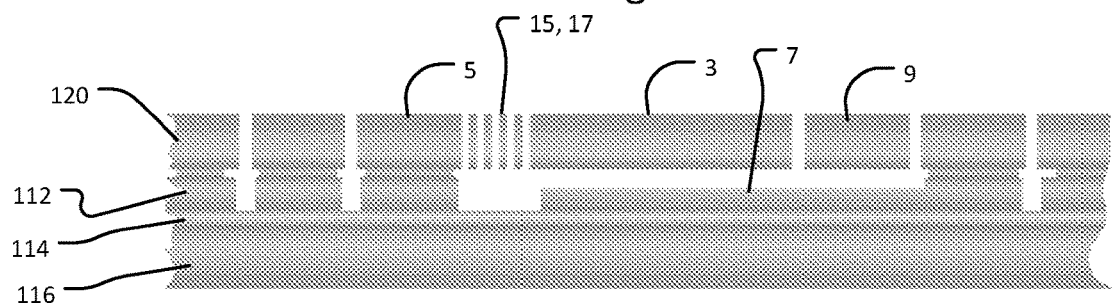

The handle layer and buried oxide of the device wafer are removed by RIE or wet etch, such as KOH or TMAH followed by BOE or HF. This leaves only the device layer 120 supported on the lower wafer 110 as shown in FIG. 2E. At this point, the flexures 12 and the proof mass 3 have been defined in some cases.

In general, the flexures 12, comb drives, 15, 17, 21, 23, drive electrodes 5a and 5b, pickoff electrodes 9, and the proof mass 3 can be fabricated out of the device layer 120 before bonding it to the LSP wafer, or after the bonding and the removal of the handle.

The reason to use the handle for installing the device layer 120 is that the device layer alone may not be strong enough to survive processing; the handle supports it until it is bonded to the LSP wafer 110. For sufficiently thick device layers, the handle may not be needed.

There are other possible approaches for installing the device layer 120. For example, the starting device wafer may also have layers of different doping. A heavily p-type doped layer (denoted p+) may be bonded to a less doped p− layer. Etchants such as EDP preferentially remove lower doped silicon, so this interface between doping concentrations can be used instead of the buried oxide of an SOI wafer to define the handle layer stop. This technique has the potential to introduce stress issues related to the p+/p− interface formation. Next the device features are etched using a Deep Reactive Ion Etching technique (DRIE), if not fabricated previously. These features include the flexures 12 that suspend the proof masses 3, the electrostatic comb drives that provide the driving and sensing functions for the motion of the masses, and holes in the mass itself to relieve gas damping effects. This etching will penetrate fully through the device layer 120 and contact the LSP layer which contains the sense plate. Shown in this partial schematic cross section FIG. 2E are a proof mass 3, comb drive structures 15, 17, a drive electrode structure 5, and a pick-off electrode structure 9.

Depending on the design, it may be acceptable to allow this LSP layer to be etched. In some designs, however, that would adversely affect the performance. In such cases, a thin oxide layer can be applied to the sense plate prior to wafer bonding, by such techniques as PECVD or thermal oxidation. The oxide would need to be removed from the tops of the anchor mesas before bonding, which could be achieved by various forms of etching including reactive ion etching (ME), buffered oxide etching (BOE), or hydrofluoric acid (HF) etching, or alternatively by CMP.

The oxide of the device wafer, which remains after the bond to the LSP wafer 110 could be removed by Vapor HF etching, BOE, or HF. Careful timing will be required so that the thin oxide is removed without significant removal of the oxide layer that isolates the sense plate and anchor mesas from the LSP handle layer.

Alternatively, it is also possible to etch the device layer 120 before the device wafer is bonded to the LSP wafer 110. This provides superior thermal transport during the etch and frequently can improve the tolerances of the etched features. However, inverting the process steps in this way entails exposing the LSP wafer front side to whatever chemicals or plasmas are used to etch away the handle wafer of the device wafer, since the etched holes in the device layer permit access. For Ethylene Diamine Pyrochatechol (EDP) etching, this can be managed by ensuring all exposed silicon is heavily p-doped. When using the SOI version, care must be taken to avoid exposing the interior etched silicon parts to the handle removal etchants, which will indiscriminately remove silicon. The buried oxide layer may not be sufficient protection as it tends to crack from residual stresses when unsupported.

Figure 2F:
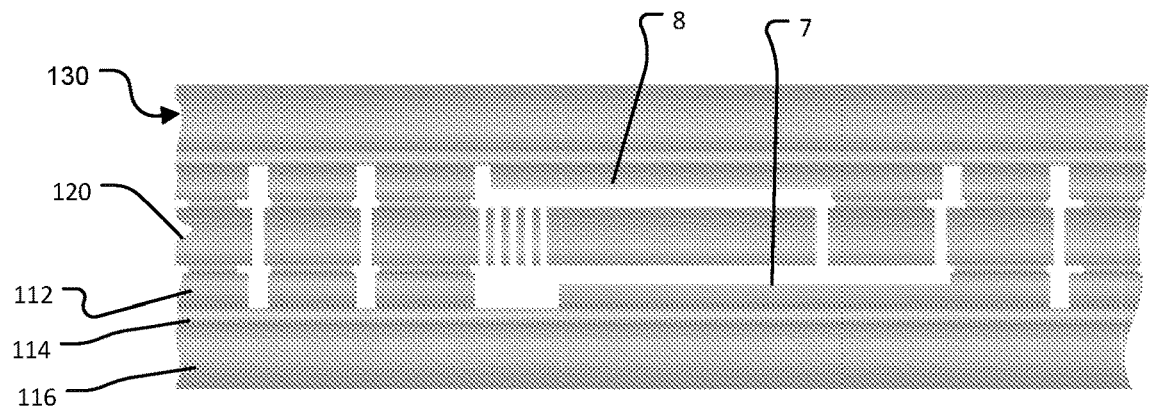

The upper sense plate (USP) wafer 130 is fabricated using the same process as the LSP wafer 110, and is bonded onto the top of the device layer 120, again with the same technique as shown in FIG. 2F This last bond seals the volumetric cavity 145 with the proof mass 3 inside, by bonding a ring fully around the device formed by the perimeter of the perimeter mesas. Thus, a volumetric region in the sealing ring and around the proof mass 3 is evacuated. The step is preferably performed under vacuum to ensure that the device cavity 145 is at vacuum after sealing. The bonding technique therefore must provide a void-free and hermetic interface that will be capable of sustaining the differential pressure, without allowing gasses to diffuse through it.

Optionally a getter material can be included inside the cavity 145. These materials react with residual gases in the cavity to hold the molecules within themselves, further assisting in maintaining a vacuum pressure level.

Getter material can be applied to the upper or lower wafer cavities, in areas not containing sense plates or anchor mesas, before the bond. Getter material must be activated by applying a high temperature while under vacuum, a step which is normally integral to the final sealing process.

Figure 2G:
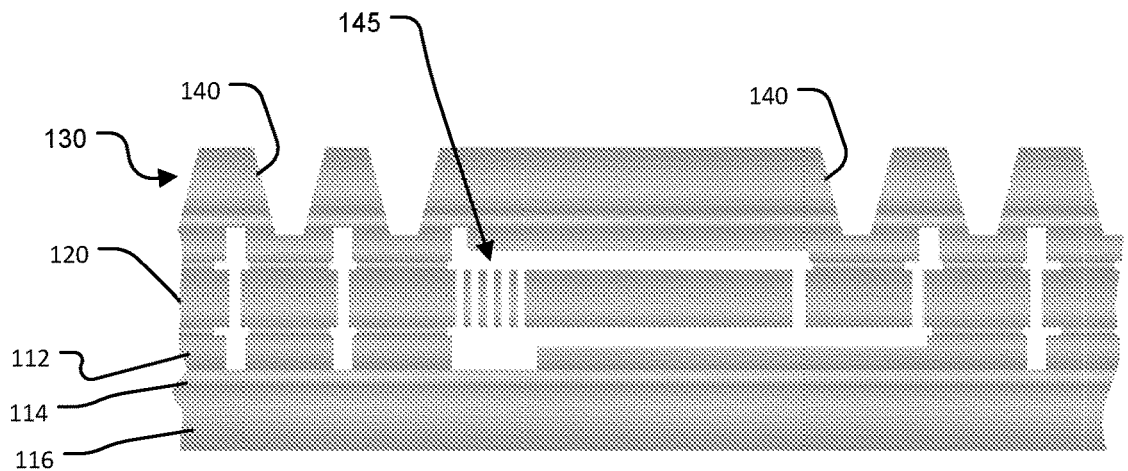

Electrical contacts must be made to the various parts of the device as well. In one embodiment, these connections are formed by etching vias 140 into the USP handle layer of the upper sense plate wafer 130 after the device is sealed as shown in FIG. 2G.

Figure 2H:
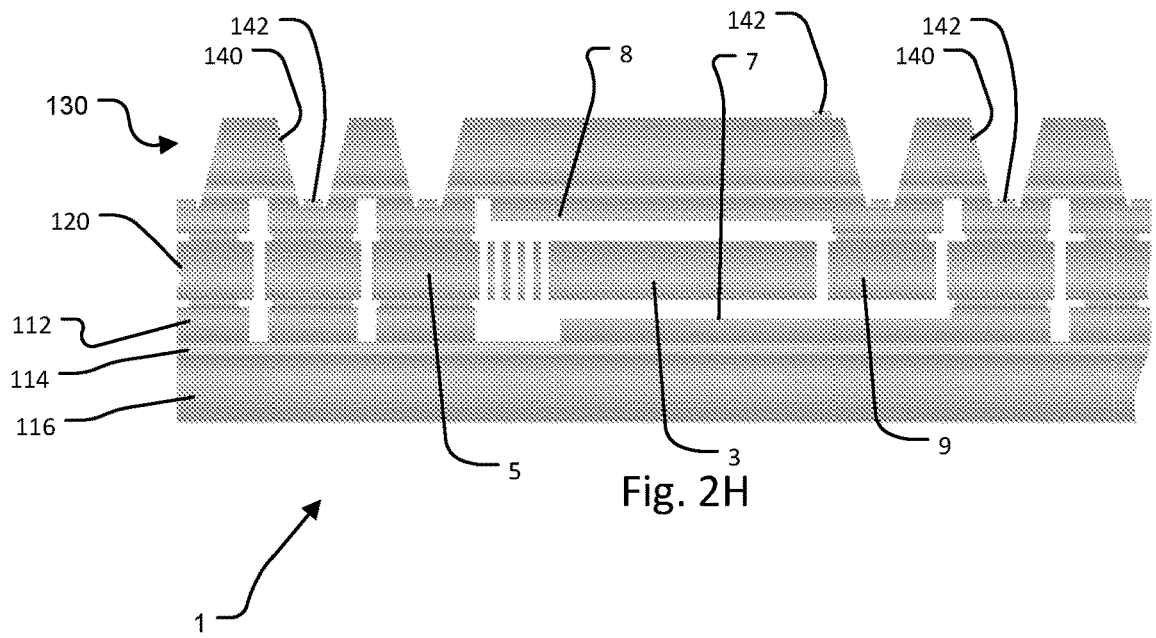

Various etching techniques, including RIE (possibly more isotropic than that used to define precision features, so that a sidewall slope is obtained) or KOH/TMAH (which naturally provides a sloped sidewall based on crystallographic differences in etch rate) can be used to etch the vias 140. The via features may be relatively large, so precision is not as essential in these etches. Then, metal pads 142 for contacts can be applied at the bottom of the vias, e.g. by shadow masked evaporation or sputtering as shown in FIG. 2H. The pads 142 are wire bonded to bring the signal up out of the cavity by wire bonding into the vias to establish electrical connects for the sensor 1.

Figure 2J:
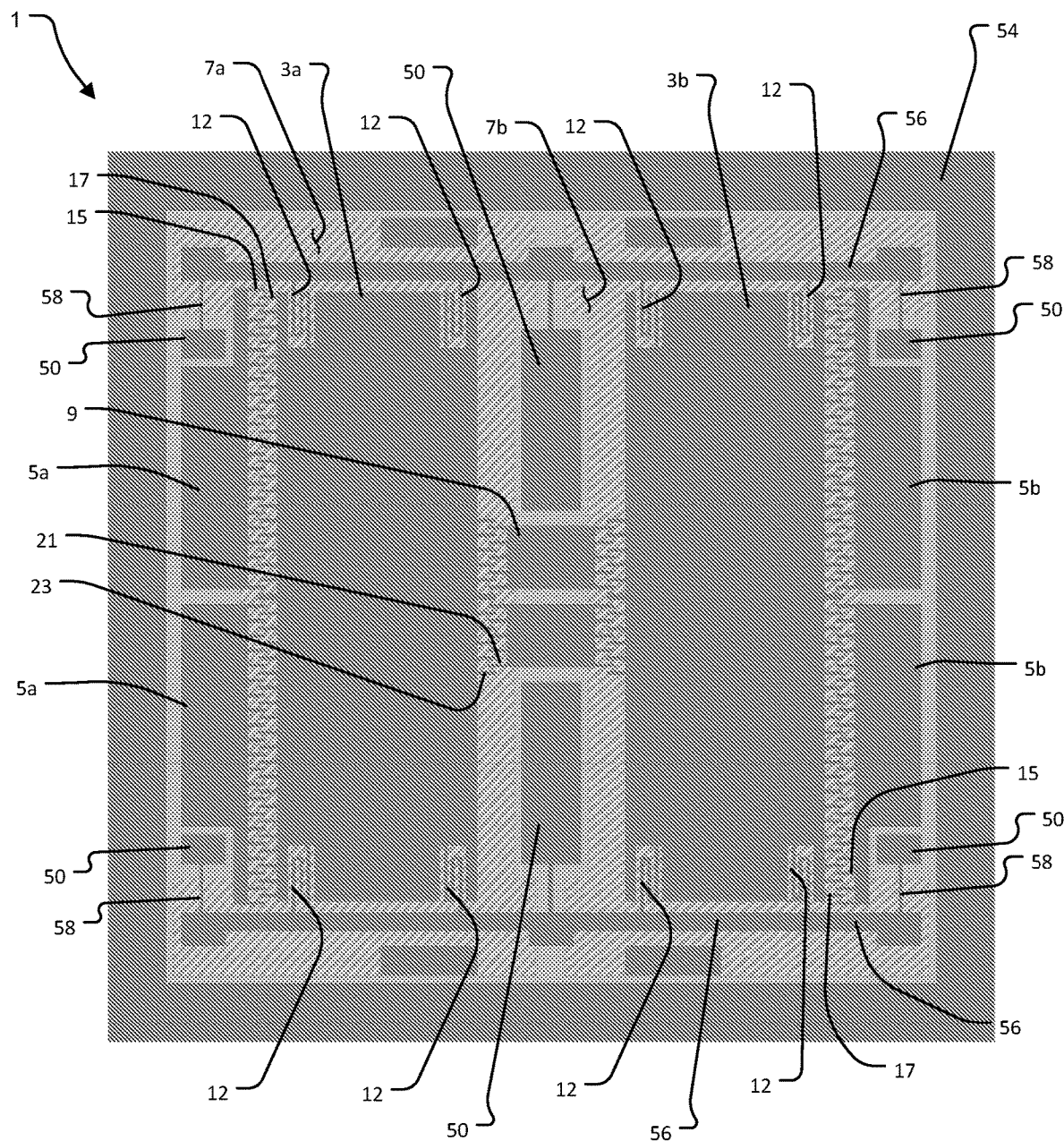
FIG. 2J shows a top view of the gyroscope produced according to the first fabrication process.

FIG. 2J shows a top down version of the tuning fork gyroscope 1 fabricated according to the first fabrication process of FIG. 2A-2H. Its proof masses 3a and 3b are suspended above respective lower sense plates 7a, 7b by support flexure structure 12.

The gyroscope 1 also includes the pair of drive electrode structures 5a and 5b, and pick-off electrode structure 9. In the illustrated example, drive electrode structures 5a, 5b and the pick-off electrode structure 9 are split top and bottom. This enables + and − voltages to be used on each side, reducing currents flowing across the device.

The lower sense plate electrodes 7a and 7b are beneath proof masses 3a and 3b. A second set of out-of-plane sense plate electrodes 8a, 8b (not shown in this view) are above proof masses 3a and 3b. The sense plates (7a, 7b, 8a, 8b) extend beyond the edge of the proof masses 3a, 3b and under the comb fingers 15, 17, 21, 23. This reduces out-of-plane forces that cause errors.

Also, the proof masses 3a and 3b here are indirectly connected to the anchors 50 by a two horizontal beams 56 at the top and bottom, with 6 exterior flexures 58 in addition to the 8 interior flexures 12. This improves the vibratory modes of the gyroscope to help control their frequencies. Also shown is the perimeter mesa 54 that forms the sealing ring completely around the perimeter.

As shown in FIGS. 3A, 3B, 3C, 3D, 3E, 3F, 3G, 3H, and 3J, alternatively, through-silicon vias (TSVs) may be formed in either the LSP wafer 110 or the USP wafer 130 or both prior to bonding according to the second fabrication process.

Figure 3A:
FIGS. 3A, 3B, 3C, 3D, 3E, 3F, 3G, 3H, and 3J are schematic partial side cross-section views taken in the region of one of the proof masses to show the successive steps of a second fabrication process for fabricating a MEMS tuning fork gyroscope sensor based on SOI wafers.

FIG. 3A, shows the USP wafer 130 being processed as an example. The USP wafer 130 has an upper sense plate layer 150, a USP handle layer 155, and an intervening silicon oxide layer 154.

Figure 3B:
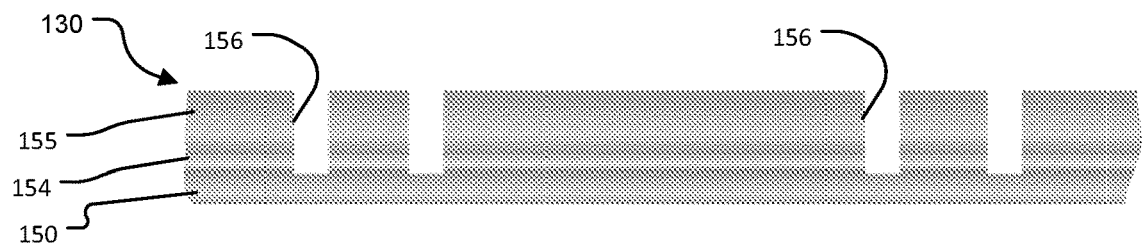

As shown in FIG. 3B, it typically involves etching holes 156 through the handle layer 155 (and possibly also into the device side) of the upper wafer, before any other processing.

Figure 3C:
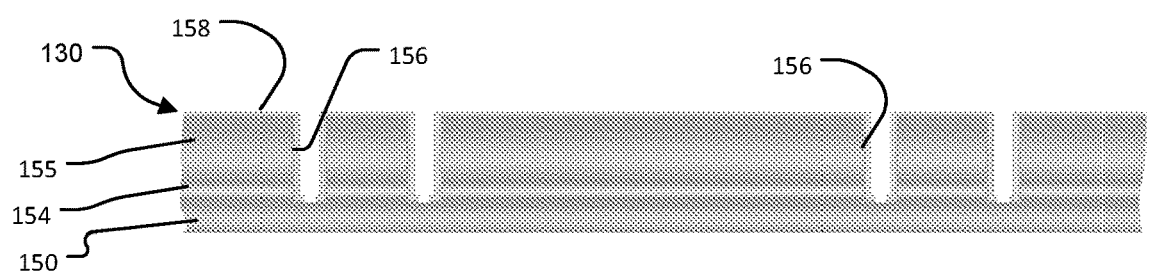

Then as shown in FIG. 3C, a conformal insulating coating 158 is applied to the USP wafer 130 including the sidewalls of the holes 156, for example by thermal oxidation or CVD. The insulating coating 158 at the hole bottom must then be etched through (if the device side was not etched).

Figure 3D:
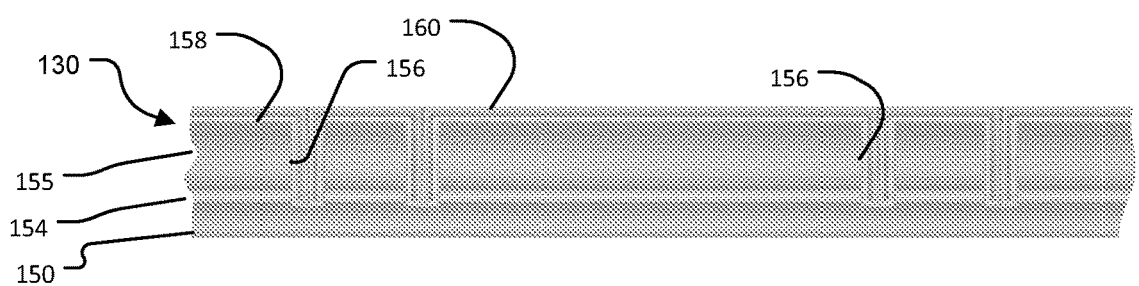
Figure 3E:
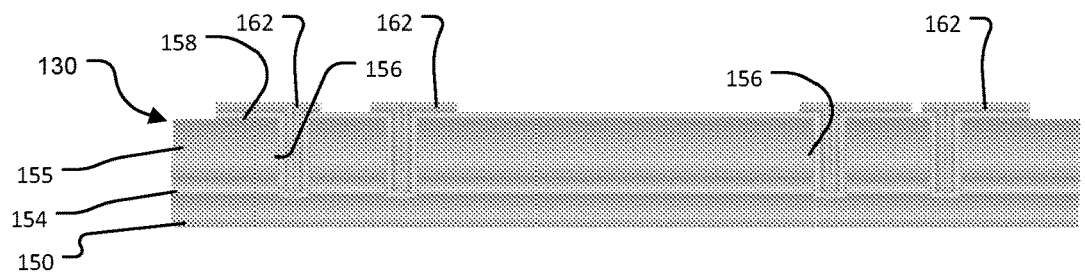

As shown in FIG. 3D, the holes 156 are then filled with a conductive material layer 160. The filling process may not completely fill the hole so long as it creates a conductive path for the electrical signal, and also does not leave a hole that would penetrate into the device cavity after sealing. Typical materials may be polysilicon (often n-type doped, but occasionally p-type) or metals including copper, tungsten, or aluminum. CMP may be used to flatten the surface of the wafer after fill processing. If the device layer was etched through to form the hole, then a conductive layer may need to be applied to the via tops, to locally re-connect the device layer silicon to the vias piercing it.

When using doped silicon it is critically important to manage the contacts between different layers. If n and p type doped layers connect, they will form a junction, adversely affecting electrical performance, behaving as a diode. This situation can be avoided by using a single doping type for all silicon, including single crystal, SOI, and polysilicon layers.

Alternatively, it may be possible to avoid the junction by ensuring a metal conductor intervenes between any two oppositely-doped silicon conductors.

Figure 3F:
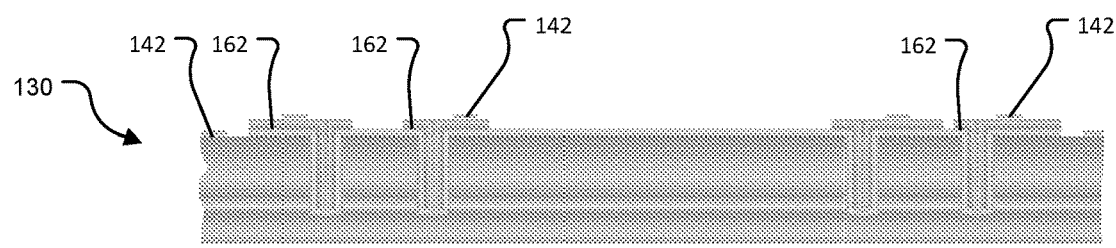

As shown in 3E, the conductive layer 160 is then patterned to form a set of contact areas 162. Metal pads 142 are then added to these contact areas as shown in FIG. 3F.

Figure 3G:
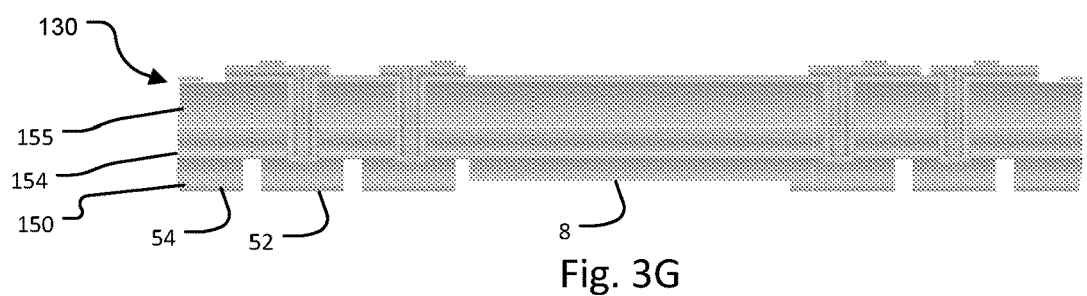
Figure 3H:
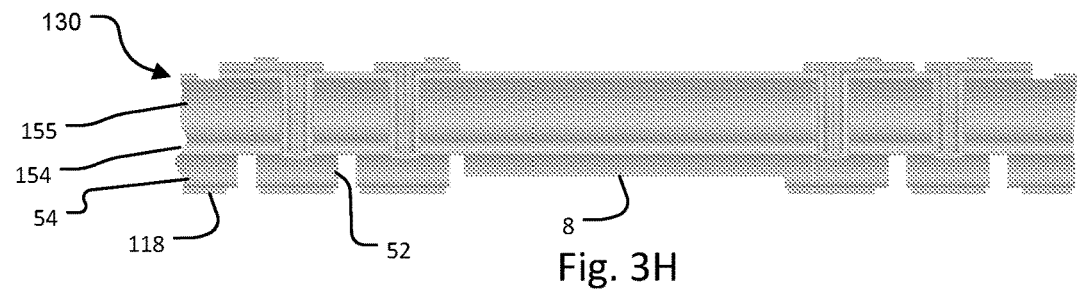

As shown in FIGS. 3G and 3H, the other side of the USP wafer 130 is then patterned.

As shown in FIG. 3G, the upper sense plate layer 150 is patterned stopping on the oxide layer 154. Specifically, the upper sense plate 8, anchor mesas 52, and perimeter mesa 54 are etched into the upper sense plate layer 150 of the wafer 130.

As shown in FIG. 3H, after the sense plate 8 and anchor mesas 52 are defined, the wafer bonding material layer 118 may be applied to the patterned upper sense plate layer 150, outside the regions of the upper sense plate 8 and specifically on the to the perimeter mesas 54.

Figure 3J:
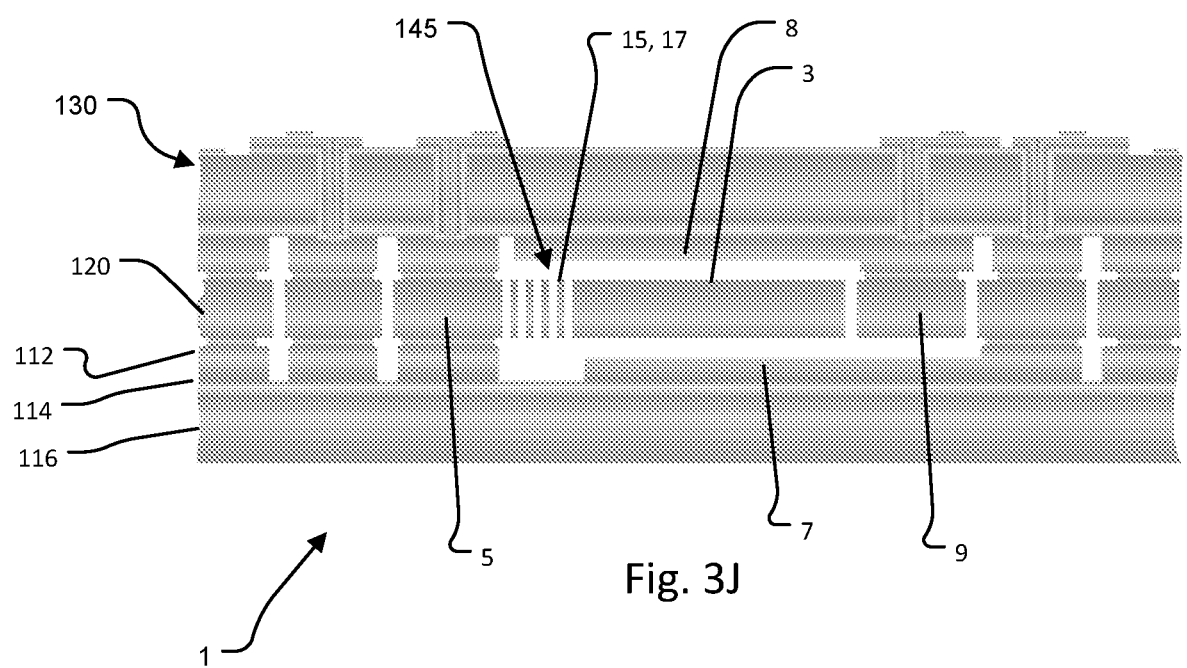

FIG. 3J shows the upper sense plate (USP) wafer 130 bonded onto the top of the device layer 120.

Still another fabrication process uses one SOI Wafer for the upper sense plate gap, one Double Side Polished (DSP) wafer for the proof mass, flexures, fingers and lower sense plate gap, and one Single Side Polished (SSP) wafer with three oxide layers, two doped polysilicon routing layers or one low pressure chemical vapor deposition (LPCVD) TEOS (TetraEthylOrthoSilicate) deposition with one or more doped polysilicon (polySi) depositions.

This third fabrication process has a number of design goals. It has upper and lower sense plates, a sealed device cavity, low pressure for high Q, electrical signals brought out to bond pads, external to sealed device cavity, and no Through Silicon Vias (TSV's) needed.

FIGS. 4A, 4B, 4C, 4D, 4E, 4F, 4G, 4H, 4J, 4K, 4L, 4M, 4N, and 4P show the third fabrication process.

Figure 4A:
FIGS. 4A, 4B, 4D, 4E, 4F, 4G, 4H, 4J, 4K, 4L, 4M, 4N, and 4P are schematic partial side cross-section views taken in the region of one of the proof masses to show the successive steps of a third fabrication process for fabricating a MEMS tuning fork gyroscope sensor based on SOI wafers.

As shown in FIG. 4A, first a USP wafer 130, which will contain the upper sense plates, is constructed. In some embodiments, this is an SOI wafer, where the sense plate 8 and anchor mesas 52 are etched into the device layer 150 of the SOI wafer. Two different etch depths will be necessary.

Figure 4B:
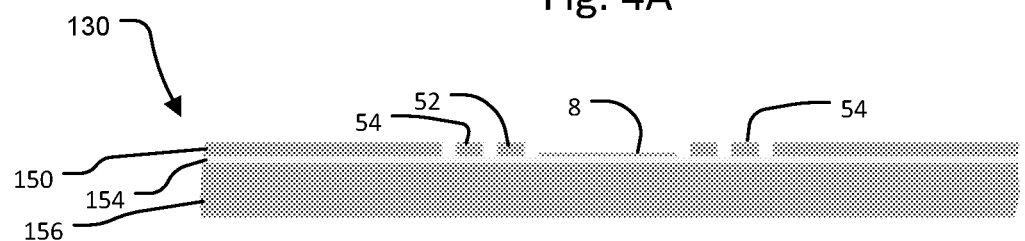

As shown in FIG. 4B, the first etch defines the gap formed between the upper sense plate 8 and the proof mass. Before the etch is performed, resist is spun onto the wafer and patterned to define the device layer area which will used for the upper sense plate. This etch can be either aqueous or dry using a reactive ion etch (RIE). The etch does not etch all the way through the SOI device layer. The device layer that remains after the etch will form the upper sense plate.

The second etch will etch through the SOI wafer device layer 150, stopping on the buried oxide 154. This etch can be RIE or DRIE. Before the etch is performed, resist will be spun onto the wafer to define the boundaries of the upper sense plate as well as posts 52 which will electrically connect the upper sense plate to the polySi layers which bring the electrical signals out of the completed device to bond pads. A seal ring is also formed from the perimeter mesa 54 so that upper sense plate wafer can be hermetically bonded to the middle wafer.

Figure 4C:
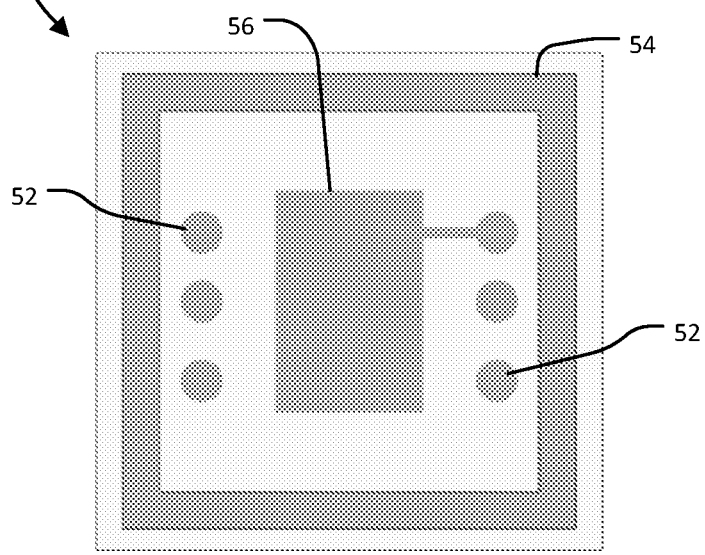
FIG. 4C is a top view of showing the proof mass during the third fabrication process.

FIG. 4C is a plan view of the USP wafer 130. It shows the perimeter mesa 54 as a continuous ring around the upper sense plate 8, along with six anchor mesas 52.

Figure 4D:
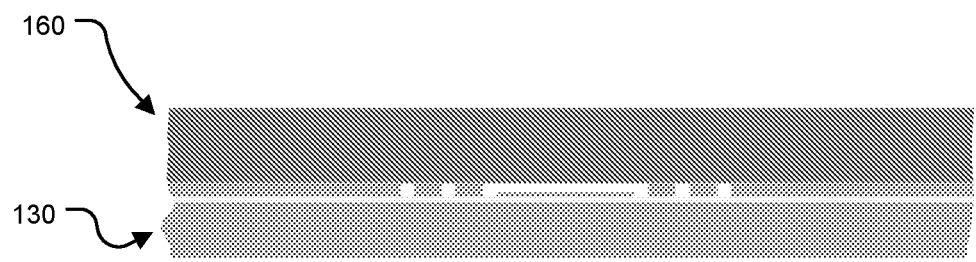

As shown in FIG. 4D, a Double Side Polished (DSP) wafer 160 is bonded to the upper sense plate wafer 130, preferably by direct bonding, eutectic or solder (metal) bonding, or silicide bonding.

Following the wafer bond, the DSP wafer 160 is thinned through wafer grind and polish steps. The final thickness of the DSP wafer is equal to the thickness of the MEMS device parts including proof mass, fingers and support beams plus the lower sense plate gap. The wafer thinning step must be performed such that there is very little variation in the thickness of the final DSP wafer thickness across the surface of the DSP wafer.

Figure 4E:
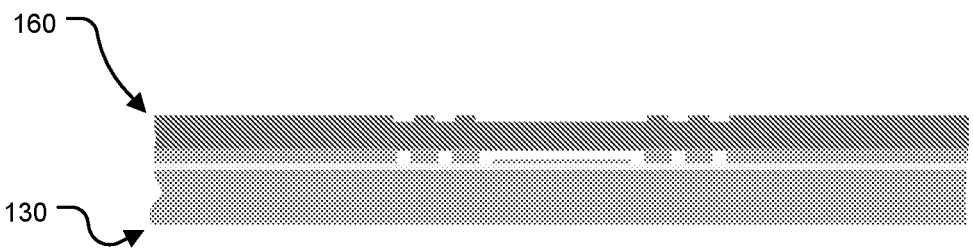
Figure 4F:
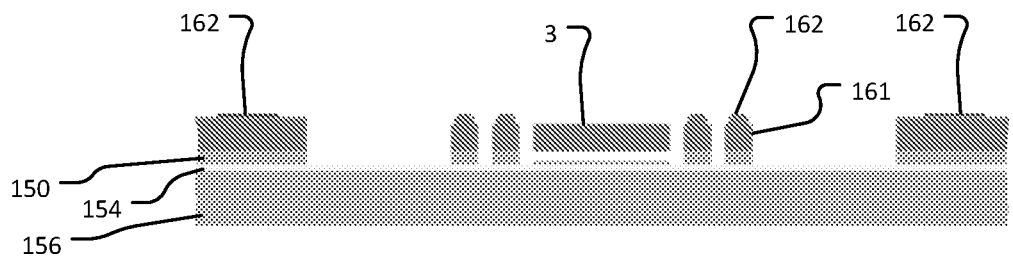

As shown in FIG. 4E, the next etch into the thinned DSP wafer 160 defines the gap formed between the lower sense plate and the proof mass. As shown in FIG. 4F, the next etch defines the seal ring to hermetically seal the device around the proof mass 3, and posts to electrically connect the upper sense plates to the bond pads. Before the etch is performed, resist is spun onto the wafer and pattered to define the device layer area which will used for the lower sense plate, as well as posts for electrical connections.

Also shown in FIG. 4F, the next step is to prepare the bonded wafer stack for bonding to the lower sense plate wafer. The figure shows the deposition of Ge pads 162 or Ge preceded by a diffusion barrier such as TiW to the top of the posts 161. The Ge and its diffusion barrier are patterned using resist in lift off or by using resist and etching off the metals. The remaining metals are present to form a eutectic metal bond with the lower sense plate wafer. The bond method used could also be silicon direct bond.

As also shown in FIG. 4F, the proof mass 3, suspension beams and fingers are defined by a DRIE etch. The DRIE etch also removes silicon so that bond pads can be accessible for wafer probe. The DRIE etch stops on the buried oxide 154 in the SOI USP wafer 130.

Figure 4G:

As shown in FIG. 4G, a second wafer is prepared starting with a Single Side Polished (SSP) wafer. This wafer 110 will contain the lower sense plates.

In the first embodiment of the process, the lower sense plate wafer 110 has a thermal oxide 164 grown on it.

A layer of doped polysilicon 166 is deposited by LPCVD. The polysilicon is patterned with resist and etched using an RIE etch.

Figure 4H:
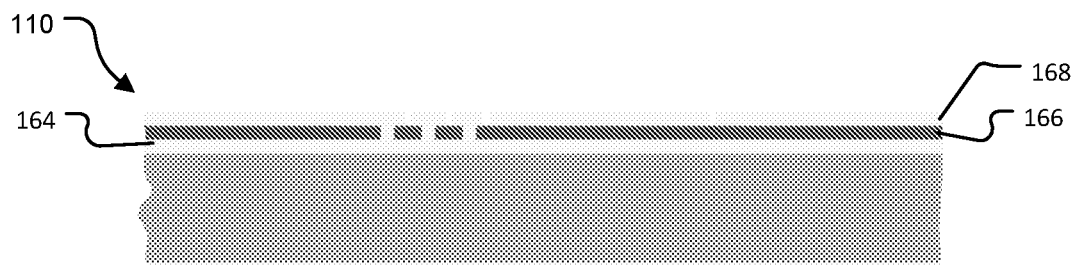

As shown in FIG. 4H, a second layer of oxide 168 is deposited by LPCVD deposition. PECVD deposition can also be used. The preferred deposition is LPCVD TEOS because it fills gaps in the polySi without any seams being formed.

The second oxide layer is patterned with resist and RIE etched to define areas on the first polySi layer 166 which will be contacted by a second polySi layer 170.

Figure 4J:
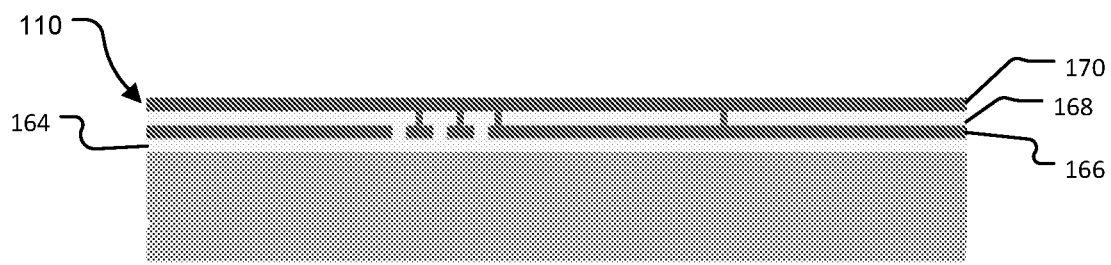

FIG. 4J, shows the deposition of the second doped polySi layer 170, which is deposited by LPCVD. This second polySi layer 170 makes mechanical and electrical contact to the first doped polySi layer 166. In an optional step after the second polySi deposition, the second layer of polySi 170 is chemical mechanically polished (CMP) such that it is smooth and flat to facilitate bonding to the wafer containing the upper sense plates.

Figure 4K:
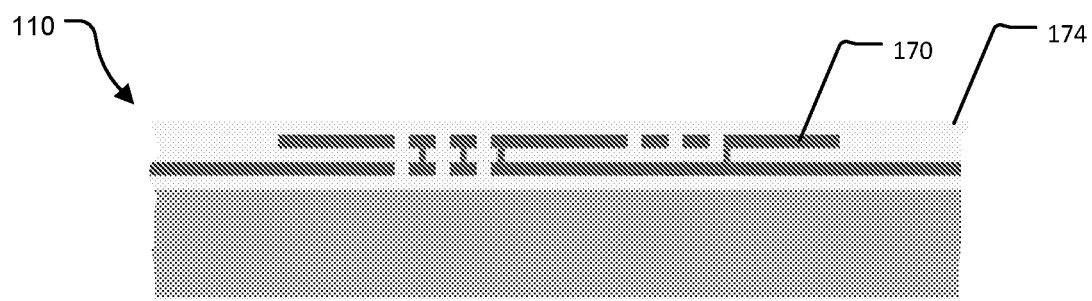

As shown in FIG. 4K, the second polySi layer 170 is then patterned with resist and RIE etched to define areas where the posts carrying the electrical connections to the upper sense plates along with the proof masses, suspension beams and fingers. It can also define the seal ring which hermetically seals the MEMS device cavity. Areas for the bond pads that are ultimately outside the hermetically sealed portion of the device are also formed. They are electrically connected to the upper sense plates, lower sense plates, proof mass, suspension beams and fingers. In this manner the electrical signals necessary for the function of the device are brought through the hermetic seal to the outside world.

A third layer of oxide 174 is then deposited by LPCVD.

Figure 4L:
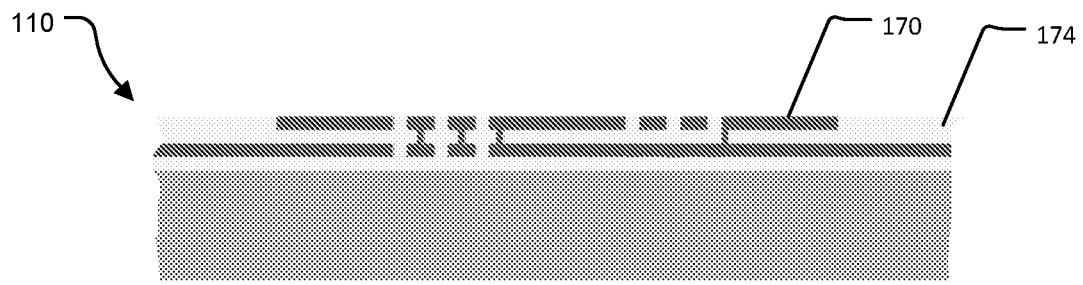

As shown in FIG. 4L, in an optional step, this third oxide layer 170 can be CMP polished, stopping on the second doped polySi layer 170. The CMP step facilitates a strong mechanical as well as electrical contact between the seal ring and the lower sense plate wafer as well as the posts to the lower sense plate wafer.

Figure 4M:
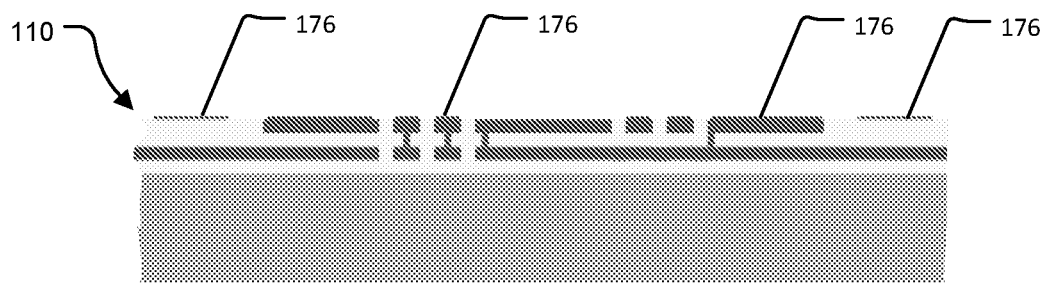

As shown in FIG. 4M, metal pads 176 for a eutectic wafer bond, such as Al, or Al with a barrier layer such as TiW are then deposited onto the lower sense plate wafer 110. The metals are patterned using resist and a metal etch, or evaporating metals through a shadow mask.

Figure 4N:
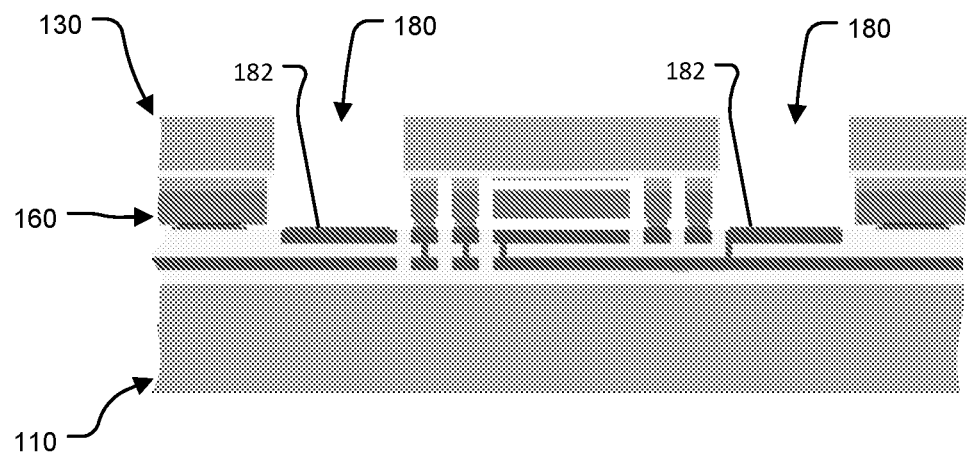

As shown in FIG. 4N, the wafer stack containing the upper sense plate wafer 130 as well as the device silicon layer formed from the DSP wafer 160 is bonded to the lower sense plate wafer 110. This bond can be a eutectic bond, such as Al/Ge, or, if no metals are deposited onto the wafers, it can be a direct bond.

The device has been partially sawn with the saw's kerf 180 exposing the device bond pads 182. In this manner the full wafer can be probed by an automated prober.

Figure 4P:
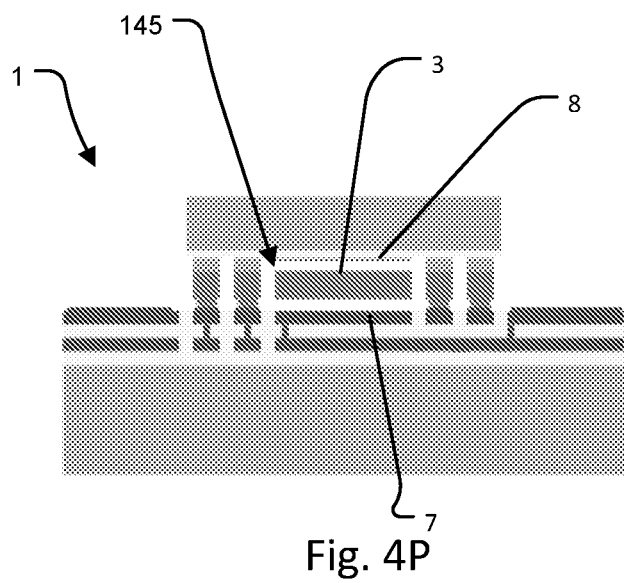

As shown in FIG. 4P, the final wafer saw is performed to separate the wafer into individual devices 1. It shows the proof mass 3 and the upper sense plate 8 and the lower sense plate 7 along with the evacuated region surrounding the proof mass 3.

FIGS. 5A, 5B, 5C, 5D, and 5E show will another an alternate method of making bottom sense plate wafer 110 using TSV's according to a fourth fabrication process. TSV's offer an alternate method to make electrical connections to the device.

The following describes an alternate method of making the lower sense plate wafer using conductive, through silicon vias (TSV's) to connect the parts of the MEMS device through the hermetic cavity to the outside of the MEMS device.

Figure 5A:
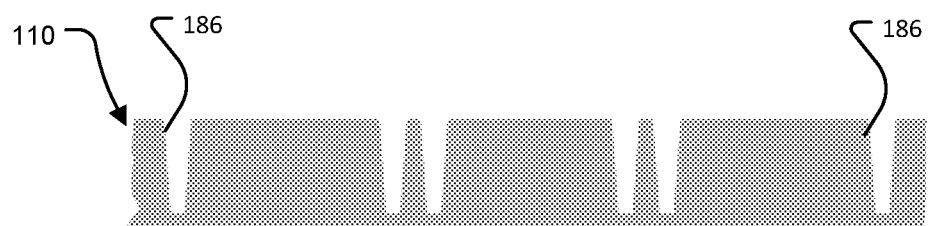
FIGS. 5A, 5B, 5C, 5D, and 5E are schematic partial side cross-section views taken in the region of one of the proof masses to show the successive steps of a fourth fabrication process for fabricating a MEMS tuning fork gyroscope sensor based on SOI wafers.

As shown in FIG. 5A, the lower sense plate wafer process begins with an SSP wafer 110.

TSV's 186 are formed in the lower sense plate wafer 110. This embodiment shows the preferred way to make them. The first step is to pattern the wafer with resist and then DRIE etch deep into the SSP wafer 100, but not all the way through it. The shape of the TSV's plays an important role. In the cross-sectional images shown, the TSV's have a tapered shape, such that the TSV's are narrowest at the bottom of the via, and widest opening is at the top of the via. The actual shape of the via that is DRIE etched can take on many forms, such as circular, square, rectangular, or a conus with a solid center. Each of these shapes has advantages and constraints.

Figure 5B:
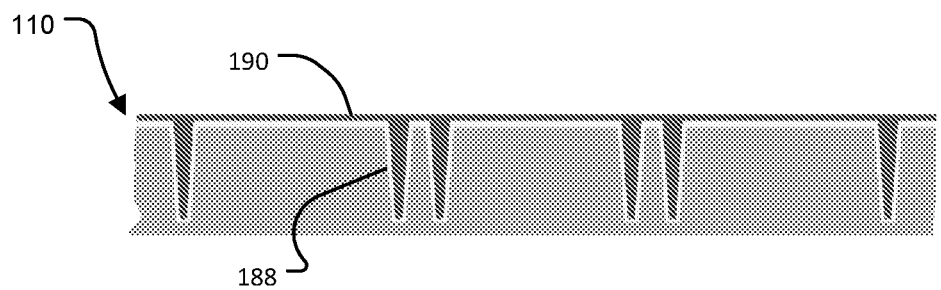

As shown in FIG. 5B, the next step is to line the TSV's with an insulator, such as a thermally grown oxide 188, or LPCVD TEOS deposited oxide.

A conductive polySi layer 190 is deposited onto the lower sense plate wafer 110 until it fills or partially fills the TSV cavities and coats the surface of the wafer. Metals can be used as a substitute for conductive polySi, but they then limit the temperature that the lower sense plate wafer can be exposed to in any further processing.

Figure 5C:
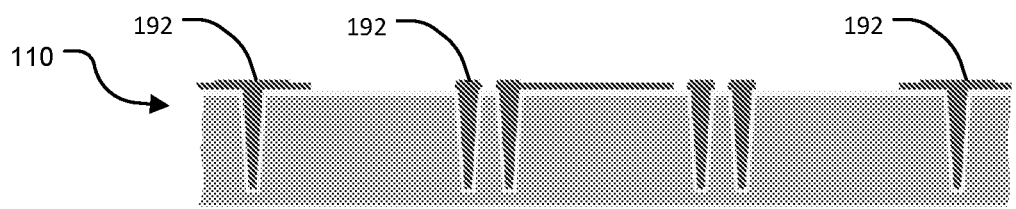

As shown in FIG. 5C, the conductive polySi 190, which coats the surface of the lower sense plate wafer 110, is then patterned with resist and RIE etched.

Al or Al and a barrier metal such as TiW for an Al/Ge eutectic bond is then deposited. The metal is patterned using resist and then etched to form exposed Al areas 192 for the Al/Ge eutectic bond. The Al/Ge bond makes both a mechanical as well as an electrical connection from the wafer contain the upper sense plates through the TSV's in the wafer containing the lower sense plates.

Figure 5D:
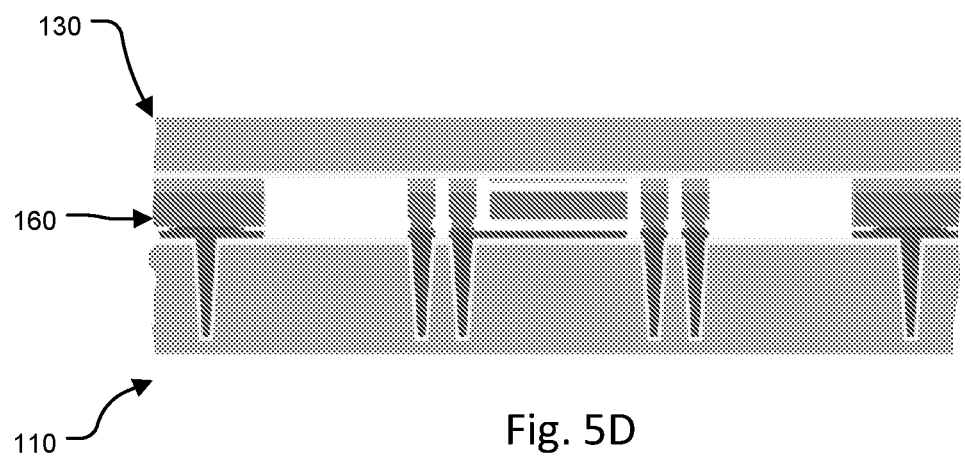

As shown in FIG. 5D, in a preferred embodiment, the upper sense plate wafer 130 and the lower sense plate wafer 110 are then bonded together with a eutectic Al/Ge bond. It is also possible to use a different set of metals for the eutectic bond. It is also possible to perform a direct bond to use a direct to bond the two wafers.

Figure 5E:
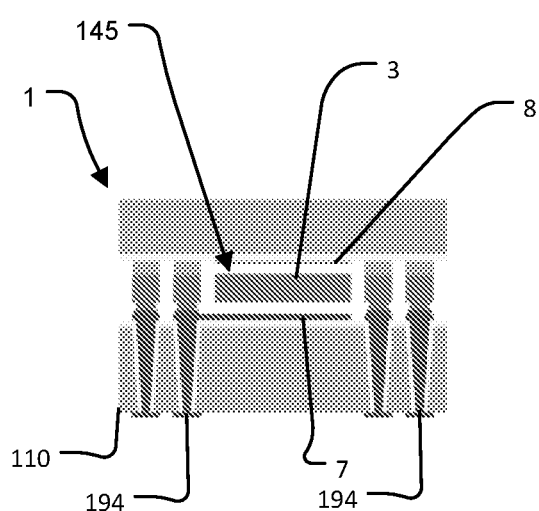

As shown in FIG. 5E, the back side of the lower sense plate wafer 110 is then ground and/or polished to expose the TSV's.

Bond pads 194 are created by depositing metal suitable for bond pads onto the exposed TSV's on the back of the lower sense plate wafer. The metal is patterned using resist and a metal etch.

The lower sense plate wafer is then ready for wafer probe in an automated prober.

The lower sense plate wafer is then sawn to separate the individual die containing the device 1.

While this invention has been particularly shown and described with references to preferred embodiments thereof, it will be understood by those skilled in the art that various changes in form and details may be made therein without departing from the scope of the invention encompassed by the appended claims.

What is claimed is:

1. A method for fabricating tuning fork gyroscope sensor, comprising:
   fabricating at least one sense plate on a silicon sense plate wafer;
   bonding the sense plate wafer to a device layer in which a proof mass is formed; and
   forming through silicon vias through the sense plate wafer having the sense plate and filling the vias to provide electrical connections to the sense plate to form the tuning fork gyroscope sensor;
   wherein the bonding the sense plate wafer to the device layer is performed in a vacuum to yield a vacuum sealed sensor.

2. The method as claimed in claim 1, further comprising filling the vias to provide electrical connections to drive electrodes to form the tuning fork gyroscope sensors.

3. The method as claimed in claim 1, further comprising direct bonding the sense plate wafer containing the sense plate to the device layer.

4. The method as claimed in claim 1, further comprising metal bonding the sense plate wafer containing the sense plate to the device layer.

5. A method for fabricating a tuning fork gyroscope sensor, comprising:
   fabricating at least one sense plate on a silicon sense plate wafer;
   bonding the sense plate wafer to a device layer in which a proof mass is formed;
   forming through silicon vias through the sense plate wafer having the sense plate and filling the vias to provide electrical connections to the sense plate to form the tuning fork gyroscope sensor;
   providing a sealing ring around the proof mass; and
   evacuating a volumetric region in the sealing ring and around the proof mass.

6. The method as claimed in claim 5, further comprising fabricating another silicon sense plate on an other side of the proof mass.

7. The method as claimed in claim 5, further comprising directly bonding the sense plate wafer to the device layer.

8. The method as claimed in claim 5, further comprising metal bonding the sense plate wafer to the device layer.

* * * * *